United States Patent

Yamano et al.

[11] Patent Number: 6,120,971
[45] Date of Patent: Sep. 19, 2000

[54] LITHOGRAPHIC PRINTING PLATE MATERIAL

[75] Inventors: Motozo Yamano; Kunihiro Nakagawa; Toshiro Kondo, all of Tokyo, Japan

[73] Assignee: Mitsubishi Paper Mills Limited, Tokyo, Japan

[21] Appl. No.: 09/122,633

[22] Filed: Jul. 27, 1998

[30] Foreign Application Priority Data

Jul. 31, 1997 [JP] Japan ................................. 9-206304
Jul. 31, 1997 [JP] Japan ................................. 9-206305

[51] Int. Cl.$^7$ ............................. G03C 8/06; G03C 1/047; G03F 7/07
[52] U.S. Cl. ..................... 430/204; 430/227; 430/230; 430/248; 430/642
[58] Field of Search ............................. 430/204, 230, 430/248, 259, 256, 227, 232, 642

[56] References Cited

U.S. PATENT DOCUMENTS

| | | | |
|---|---|---|---|
| 3,369,901 | 2/1968 | Fogg et al. | 430/227 |
| 4,360,590 | 11/1982 | Tomka | 430/642 |
| 4,605,609 | 8/1986 | Okazaki et al. | 430/232 |
| 4,606,985 | 8/1986 | Takaya et al. | 430/204 |
| 4,743,525 | 5/1988 | Yamamoto et al. | 430/204 |
| 5,449,585 | 9/1995 | Coppens et al. | 430/204 |
| 5,456,999 | 10/1995 | Vaes et al. | 430/204 |
| 5,508,142 | 4/1996 | Coppens et al. | 430/204 |
| 5,620,830 | 4/1997 | Coppens et al. | 430/204 |
| 5,672,461 | 9/1997 | Coppens et al. | 430/204 |
| 5,795,697 | 8/1998 | Coppens et al. | 430/204 |

FOREIGN PATENT DOCUMENTS 8-110641  4/1996  Japan .

*Primary Examiner*—Richard L. Schilling
*Attorney, Agent, or Firm*—Pillsbury Madison & Sutro Intellectual Property Group

[57] ABSTRACT

There is disclosed an aluminum lithographic printing plate material which comprises an aluminum substrate, a silver halide emulsion layer and a physical development nuclei layer between the aluminum substrate and the silver halide emulsion layer, said silver halide emulsion layer contains photographic gelatin and gelatin having a weight average molecular weight of about 50,000 or less is contained in said silver halide emulsion layer and/or under said layer.

6 Claims, No Drawings

LITHOGRAPHIC PRINTING PLATE MATERIAL

BACKGROUND OF THE INVENTION

This invention relates to a lithographic printing plate material using an aluminum plate as a support, particularly to an aluminum lithographic printing plate material using a silver complex salt diffusion transfer method.

Some examples of a lithographic printing plate using the silver complex diffusion transfer process (the DTR process) are described on pages 101 to 130 of Andre Rott and Edith Weyde, "Photographic Silver Halide Diffusion Processes", published by the Focal Press, London and New York (1972).

As described therein, there have been known two kinds of lithographic printing plates using the DTR process, i.e., a two sheet type in which a transfer material and an image-receiving material are separated and a mono-sheet type in which these materials are provided on one support. The two sheet type lithographic printing plate is described in detail in Japanese Provisional Patent Publication No. 158844/1982. Also, the mono-sheet type is described in detail in U.S. Pat. No. 3,728,114, Japanese Patent Publications No. 30562/1973 and No. 15765/1976, and Japanese Provisional Patent Publications No. 111103/1976 and No. 150105/1977.

A lithographic printing plate using paper as a support is difficult to obtain a high quality printing including good printing endurance due to plate elongation or penetration of water during printing. A film support has been used to overcome these problems and to improve printing characteristics.

The lithographic printing plate using a film has been improved in growth of the plate or soaking of a water content as compared with the printing plate using paper. However, there remains the problems in the points of printing endurance, water retention characteristics and setting a plate in a printer, etc.

Thus, in order to overcome the above problems of the lithographic printing plate using paper or a film as a support as mentioned above, a lithographic printing plate of a silver complex system using an aluminum plate as a support has been known and is described in detail in, for example, U.S. Pat. No. 4,335,197, U.S. Pat. No. 4,425,420, U.S. Pat. No. 5,068,165 and U.S. Pat. No. 5,213,943, and Japanese Provisional Patent Publications No. 118244/1982, No. 158844/1982, No. 260491/1988, No. 116151/1991, No. 282295/1992, No. 216236/1993 and No. 81194/1994.

In the above publications using an aluminum lithographic printing plate, a mono-sheet type lithographic printing plate utilizing the DTR process is described in detail and physical development nuclei are carried on a roughened and anodized aluminum support, and a silver halide emulsion layer is further provided thereon. A general process for making this lithographic printing plate comprises the steps of exposure, DTR development processing, water washing processing (washing off: removal of a silver halide emulsion layer with warm water, hereinafter merely referred to as "washing processing") and finishing processing.

The DTR printing plate using an aluminum plate has various problems as compared with the DTR printing plate using paper or a film as a support. For example, a silver halide emulsion layer which has not substantially cured has an extremely high swelling property so that it swells at development whereby causing the problem that an image quality, particularly fine-line reproducibility is lowered. This is a particularly serious problem in a printing plate for a scanning type exposure such as an argon laser, He—Ne laser, red LD laser, LED, infrared LD laser, etc.

Particularly when a light source with a wavelength of 600 nm or longer is used, a significantly high sensitivity is required for a silver halide emulsion so that it involves the problems of easily causing fogging and bad storage stability. Thus, in a printing plate stored for a long period of time, stain of the ground is likely caused and particularly when a large amount of printing plates are to be subjected to development processing, which is so-called "running processing", there is the problem of lowering in printing characteristics.

In the field of a web-offset press printing machine, in order to prevent lack of paper, an etching using damping water is omitted in many cases when starting up the printing procedure, and the printing method of applying an ink on the whole surface of the plate and then sending damping water to remove the ink at an non-image portion is carried out. When the lithographic printing plate which is subjected according to the present invention is applied to such a printing method, there are problems that a removing rate of the ink at the non-image portion is late and the ink at the image portion is also removed.

In Japanese Provisional Patent Publication No. 110641/1996, an aluminum plate using a gelatin having a weight average molecular weight of 70,000 or less is disclosed. It is described therein that when such a gelatin is used, ink receptivity is improved. However, when the weight average molecular weight of gelatin becomes small, there is a problem that ink removing property is lowered due to the running processing.

Also, in the DTR printing plate using an aluminum plate, there are problems that dot-like fogging (the DTR transferred silver portion becomes white dot state) caused by an aluminum plate or stripe state desensitization (striped transferred silver occurs at the non-image portion) occur. These problems are likely caused when the printing plate is stored. These problems cannot be easily solved by the well known antifoggant 1-phenyl-5-mercaptotetrazole. Even if it is solved by the antifoggant, there occurs another problems that lowering in sensitivity is significantly remarkable or DTR development rate is markedly restrained.

As one of the serious problems in the process for preparing a lithographic DTR printing plate using an aluminum, there is a problem that gelatin in the silver halide emulsion layer be removed at the washing processing. In an aluminum lithographic printing plate, removal of the silver halide emulsion layer by washing is a particularly important process to completely expose the silver image portion and the non-image portion constituted by the aluminum surface itself. The silver image portion is particularly required to have a high lipophilicity which accepts an ink, and a substance which prohibits lipophilicity such as gelatin, etc. shall be removed completely.

As the above washing processing, a method of peeling and removing an emulsion layer by spraying a washing solution at a temperature of 25 to 35° C. with the jet system, or a method of peeling an emulsion layer by scrubbing rollers while spraying a washing solution, is generally employed. However, according to the above-mentioned methods of physically peeling and removing the emulsion layer, it is difficult to completely remove the emulsion layer so that there is a problem of lowering in water retention characteristics or ink receptivity. It is a serious problem in lowering of a washing off property (peeling and removal of a silver halide emulsion layer) in the running processing.

On the other hand, a washing solution is circulated through a filtration filter and emulsion layer-constituting components (gelatin or various kinds of additives) dissolved or dispersed in the washing solution are recovered to use the washing solution again. However, it is extremely difficult to completely recover the respective components in the emulsion layer dissolved out or dispersed in the washing solution. Accordingly, during the running processing, deposited materials are adhered to transport rollers, squeeze rollers and scrubbing rollers whereby the plate surface of the lithographic printing plate is damaged or washing off property is lowered.

SUMMARY OF THE INVENTION

An object of the present invention is to provide a DTR lithographic printing plate using an aluminum plate as a substrate which is excellent in printing endurance and ink removable property, and having a good running processing property, and particularly to provide a DTR lithographic printing plate suitable for scanning exposure.

Another object of the present invention is to provide a DTR lithographic printing plate using an aluminum plate as a substrate which causes no dot-like fogging caused by an aluminum plate and has good fine-line reproducibility and storage stability.

A further object of the present invention is to an aluminum lithographic printing plate which is improved in washing off property at water washing, and excellent in ink receptivity and water retention characteristics, particularly it prevents in lowering of washing off property at the running processing.

A further object of the present invention is to provide to an aluminum lithographic printing plate in which deposited materials are prevented from adhering to rollers of a processing apparatus.

The above objects of the present invention have been accomplished by using photographic gelatin (gelatin for photography) and a low molecular weight gelatin having a weight average molecular weight of about 50,000 or less in combination.

That is, the present invention relates to an aluminum lithographic printing plate material which comprises an aluminum substrate, a silver halide emulsion layer and a physical development nuclei layer between the aluminum substrate and the silver halide emulsion layer, said silver halide emulsion layer contains photographic gelatin and gelatin having a weight average molecular weight of about 50,000 or less is contained in said silver halide emulsion layer and/or under said layer.

DESCRIPTION OF THE PREFERRED EMBODIMENTS

In the following, embodiments of the present invention are shown.

(1) The silver halide emulsion layer contains photographic gelatin and gelatin having a weight average molecular weight of about 50,000 or less.

(2) The silver halide emulsion layer contains photographic gelatin, and gelatin having a weight average molecular weight of about 50,000 or less is contained under the silver halide emulsion layer.

(3) The silver halide emulsion layer contains photographic gelatin and gelatin having a weight average molecular weight of about 50,000 or less, and gelatin having a weight average molecular weight of about 50,000 or less is contained under the silver halide emulsion layer.

The low molecular weight gelatin to be used in the present invention can be prepared by various methods as described in, for example, Japanese Provisional Patent Publications No. 158426/1989, No. 340539/1992, etc., preferably by an enzyme decomposition method. The weight average molecular weight of the low molecular weight gelatin is about 50,000 or less, preferably about 3,000 to about 30,000. The average molecular weight of 50,000 or less is not a strict numerical limitation, and, for example, up to 5% higher than the value can be allowed so that it can be defined as "about 50,000 or less". An amount of the low molecular weight gelatin to be used may vary depending on the weight average molecular weight of the gelatin. When it is contained in the silver halide emulsion layer, gelatin having a weight average molecular weight of about 30,000 or less is to be contained as an index in an amount of 1 to 150% by weight, preferably 2 to 100% by weight, more preferably 2 to 50% by weight based on the amount of photographic gelatin (having a weight average molecular weight around 100,000 or more) in said silver halide emulsion layer, and gelatin having a weight average molecular weight of about 30,000 to about 50,000 is 3 to 200% by weight, preferably 5 to 150% by weight, more preferably 5 to 100% by weight based on the same.

In the photographic gelatin, a low molecular weight gelatin is indispensably contained in a certain small amount but the low molecular weight gelatin as mentioned above is clearly different from such a component. The characteristic feature of the present invention resides in using the photographic gelatin and the low molecular weight gelatin are used in combination. As a method for measuring the molecular weight of gelatin, the gel filtration method, the ultracentrifugation method, etc. have been known. In the present invention, the molecular weight is measured by the gel filtration method using a protein the molecular weight of which is known as a standard.

The low molecular weight gelatin to be used in the present invention may be added to an under side of the abovementioned silver halide emulsion layer, i.e., to the physical development nuclei layer or to an intermediate layer which may be provided between the silver halide emulsion layer and the physical development nuclei layer if necessary. In such a case, it may be the low molecular weight gelatin alone or in combination with photographic gelatin (the ratio of the low molecular weight gelatin is substantially the same amount as that mentioned above). The low molecular weight gelatin may be used in a plural number of layers including, for example, a silver halide emulsion layer and at least one layer under the silver halide emulsion layer as a matter of course. In the present invention, it is preferred that the gelatin containing layer is not substantially cured in view of washing off property at the water washing processing. The silver halide emulsion layer can be spectrally sensitized by a known sensitizing dye depending on the wavelength of the light source such as laser, etc. The sensitizing dye to be preferable used in the present invention is a sensitizing dye having no acidic group in the molecule, preferably a cation type sensitizing dye. The cation type sensitizing dye means that it has no acidic group in the molecule comprising a sulfo group or a carboxy group.

By using the sensitizing dye having no acidic group as mentioned above and a low molecular weight gelatin in combination, storage stability can be improved. That is, dot fogging (white dot of transferred silver) after storage or stain of the ground does not occur and ink removable property can be improved.

The sensitizing dyes having no acidic group to be used in the present invention are compounds represented by the following formulae (I), (II) and (III). Of these, particularly preferred is the sensitizing dye represented by the formula (III) shown below.

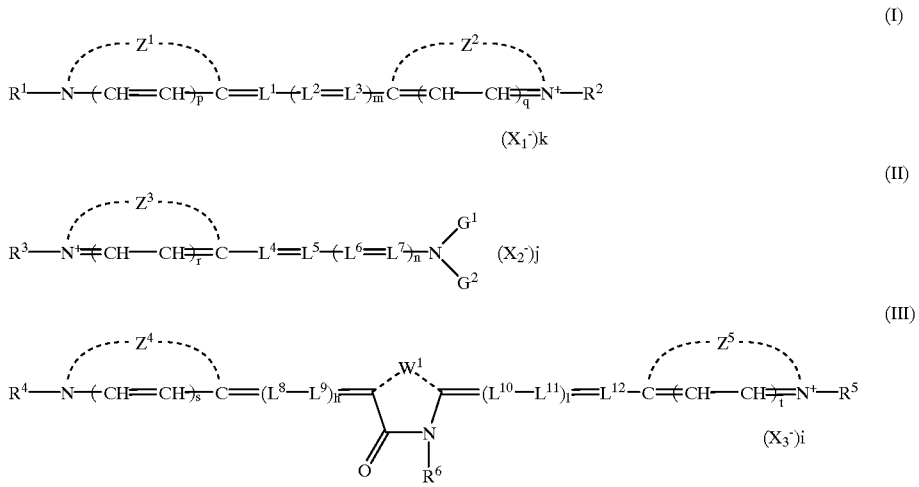

wherein $Z^1$ to $Z^5$ each represent atomic group necessary for forming a 5- or 6-membered heterocyclic ring, and the heterocyclic rings are two or more, the respective heterocyclic rings may be the same or different from each other; $R^1$ to $R^5$ may be the same or different from each other and each represent a substituted or unsubstituted alkyl group; R6 represents a hydrogen atom, a substituted or unsubstituted alkyl group, a substituted or unsubstituted aryl group or a heterocyclic group; $G^1$ and $G^2$ may be the same or different from each other and represent a substituted or unsubstituted alkyl group, a substituted or unsubstituted aryl group; or $G^1$ and $G^2$ may form a ring with derived from a cyclic secondary amine; $W^1$ represents atomic group necessary for forming a 5- or 6-membered heterocyclic ring; $L^1$ to $L^{12}$ each represent a substituted or unsubstituted methyne group; p, q, r, s and t each represent 0 or 1, h, l and m represents 0, 1, 2 or 3; k and i represents 0 or 1; j represents 1 or 2; n represents 0, 1 or 2; $X^1$ to $X^3$ represents a counter ion (for example, a methylsulfate ion, an ethylsulfate ion, a thiocyanate ion, a toluenesulfonate ion, a chlorine ion, a bromine ion, an iodine ion, a perchlorate ion, a sodium ion, a potassium ion, a trimethylammonium ion, etc.).

As the 5- or 6-membered heterocyclic ring of $Z^1$ to $Z^5$, there may be mentioned, for example, a thiazole nucleus, a benzothiazole nucleus, a naphthothiazole nucleus, a thiazoline nucleus, an oxazole nucleus, a benzoxazol nucleus, a naphthoxazole nucleus, an isoxazole nucleus, an oxazoline nucleus, a selenazole nucleus, a benzoselenazole nucleus, a naphthoselenazole nucleus, a tellurazole nucleus, a benzotellurazole nucleus, a naphthotellurazole nucleus, a 3,3-dialkylindolenine nucleus, an imidazole nucleus, a benzimidazole nucleus, a naphthoimidazole nucleus, a pyridine nucleus, a quinoline nucleus, an imidazo[4,5-b]quinoxaline nucleus, an oxadiazole nucleus, etc. These heterocyclic nuclei may have at least one substituent such as an alkyl group, an aryl group, an aralkyl group, a halogen atom, an alkoxy group, an alkoxycarbonyl group, a hydroxy group, a nitro group, etc.

As $W^1$, preferred are as mentioned below:

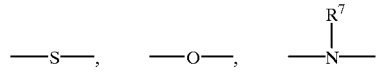

(where $R^7$ has the same meaning as defined in $R^6$ in the formula (III)),

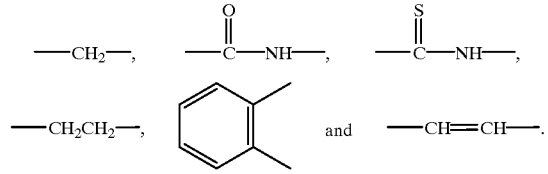

As the substituent for the substituted methyne group of $L^1$ to $L^{12}$, there may be mentioned, for example, an alkyl group (methyl, ethyl, etc.), an aryl group (a phenyl group, etc.), an aralkyl group (a benzyl group, etc.), a halogen atom (chlorine, bromine, etc.), an alkoxy group (methoxy, ethoxy, etc.) and the like, and the substituents of the methyne chain may form a 4- to 6-membered ring.

As the substituted or unsubstituted alkyl group represented by $R^1$ to $R^6$ and $G^1$ to $G^2$, there may be mentioned, for example, an unsubstituted alkyl group having 1 to 18 carbon atoms, preferably 1 to 7 carbon atoms, particularly preferably 1 to 4 carbon atoms (including methyl, ethyl, propyl, isopropyl, butyl, hexyl, octyl, etc.) and a substituted alkyl group (benzyl, 2-phenylethyl, 2-hydroxy-ethyl, 3-hydroxypropyl, 2-methoxyethyl, 2-(pyrrolidin-2-one-1-yl) ethyl, 2-acetoxyethyl, carbomethoxymethyl, 2-methanesulfonylaminoethyl, allyl group, etc.). As the aryl group and the heterocyclic group represented by $R^6$ and $G^1$ to $G^2$, there may be mentioned, for example, phenyl, 2-naphthyl, 3-chlorophenyl, 3-methylphenyl, 2-pyridyl, 2-thiazolyl, etc.

In the following, specific examples of the sensitizing dyes to be used in the present invention are enumerated.

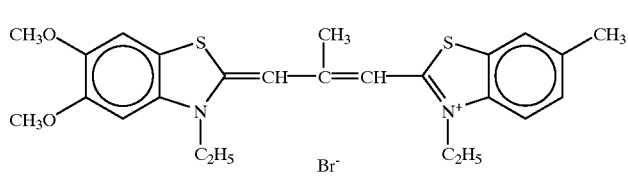 (D-1)
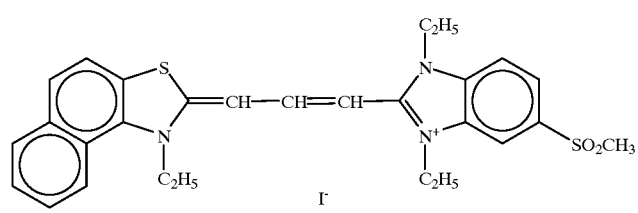 (D-2)
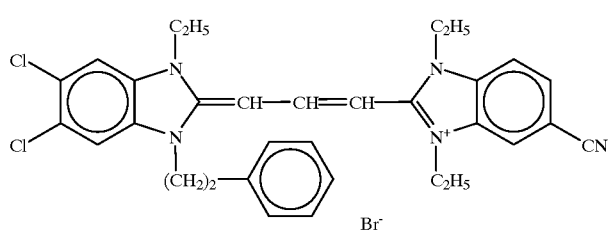 (D-3)
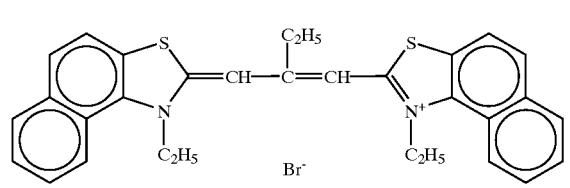 (D-4)
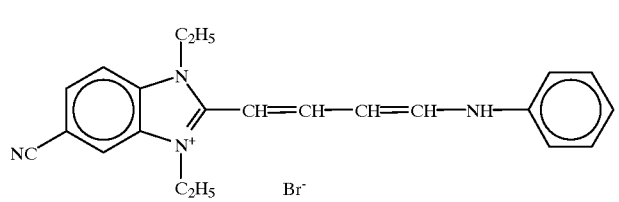 (D-5)
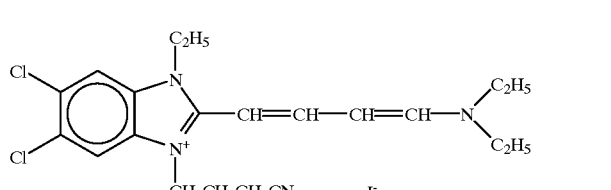 (D-6)
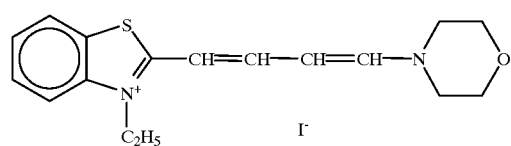 (D-7)

-continued
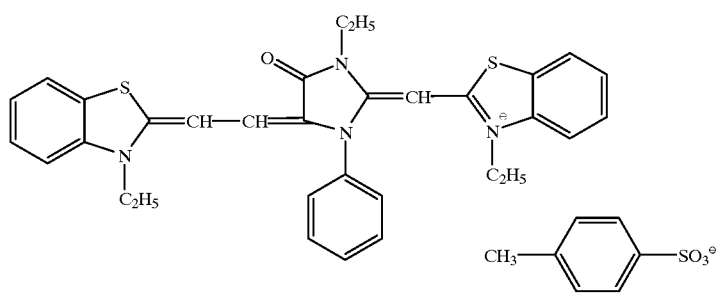
(D-8)
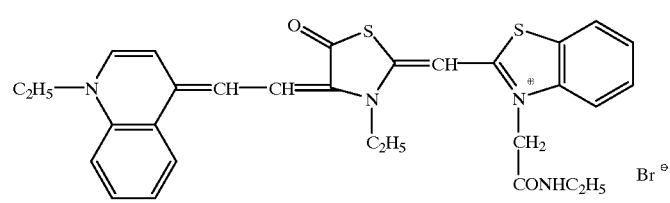
(D-9)
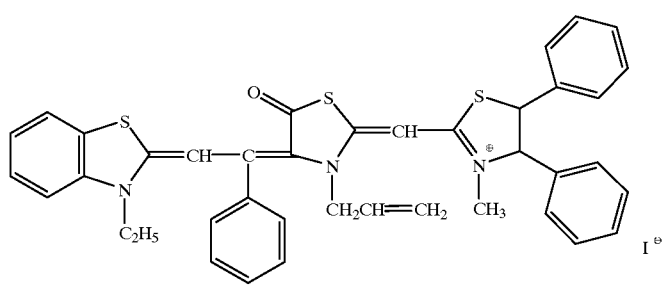
(D-10)
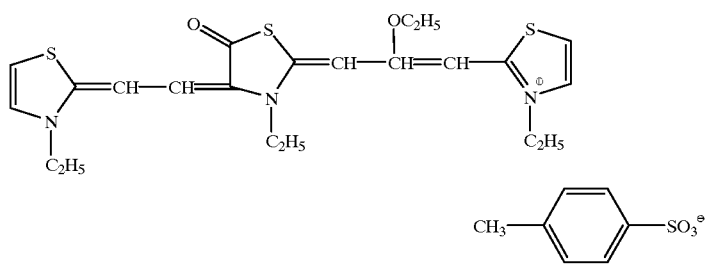
(D-11)
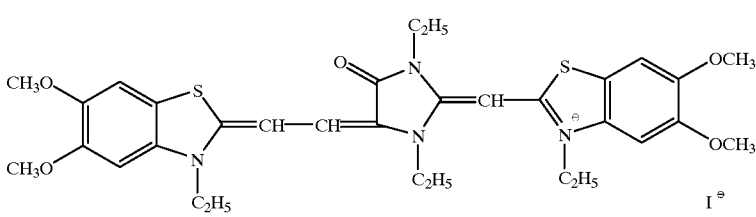
(D-12)
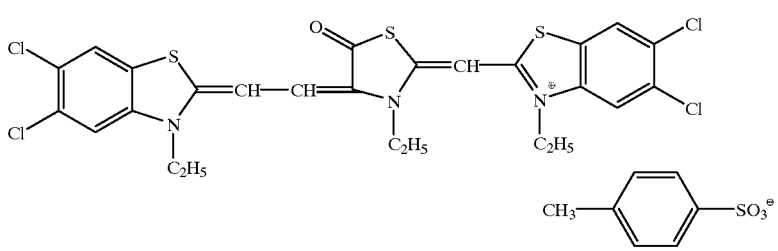
(D-13)

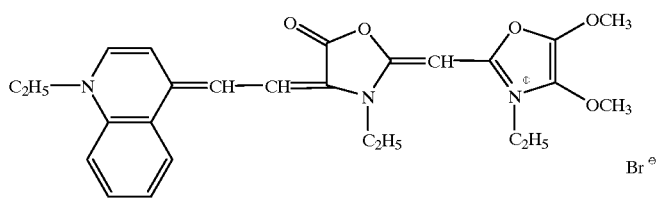

(D-14)

In the present invention, these dyes may be used alone or in combination of two or more. An amount of these sensitizing dyes to be used is not particularly limited, but it is preferably $1 \times 10^{-7}$ to $1 \times 10^{-2}$ mole, particularly preferably $1 \times 10^{-6}$ to $1 \times 10^{-3}$ mole per mole of silver halide. The timing of addition may be any time until coating a silver halide emulsion.

In the aluminum lithographic printing plate material of the present invention, a compound having at least one acidic group selected from a sulfo group and a carboxyl group, and a mercapto group is added to the silver halide emulsion layer and/or other optional layer(s).

In Japanese Provisional Patent Publication No. 72630/1995, there is disclosed a technique that an aluminum lithographic printing plate is subjected to plate making processing in the presence of 1-phenyl-5-mercaptotetrazole having an acidic group. In the present invention, an aluminum lithographic printing plate having good fine line reproducibility, storage stability and running stability without causing any bad effect by an aluminum plate, i.e., no dot fogging (white dot of transferred silver), etc. can be obtained by combining with a sensitizing dye having no acidic group.

The compound having a mercapto group mentioned above has at least one acidic group comprising a sulfo group and a carboxyl group in the molecule (hereinafter referred to as "mercapto compound" according to the present invention), and represented by the following formula.

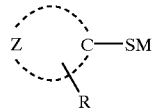

wherein R represents one or two or more sulfo group or carboxyl group bound to a carbon atom or a nitrogen atom of a heterocyclic group or an aromatic ring directly or through an alkyl group or an aryl group, etc.; Z represents an atomic group necessary for forming a 5- or 6-membered nitrogen-containing heterocyclic ring or an aromatic ring; and M represents a metal atom or an ammonium group.

As the nitrogen-containing heterocyclic ring, there may be mentioned imidazole, triazole, tetrazole, thiazole, oxazole, etc., and as the aromatic ring, a benzene ring may be mentioned. These rings may have a fused ring, and have a substituent other than the acidic group, such as an alkyl group, an alkoxy group, a halogen atom, etc.

In the following, specific examples of the mercapto compound according to the present invention is described.

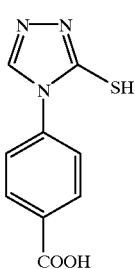

(A-1)

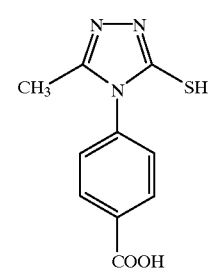

(A-2)

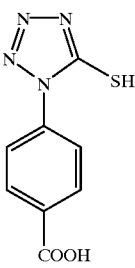

(A-3)

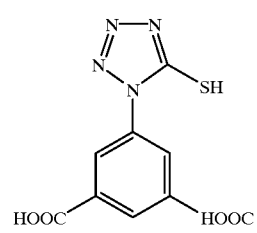

(A-4)

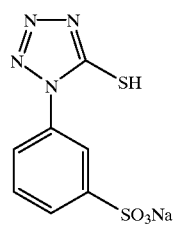

(A-5)

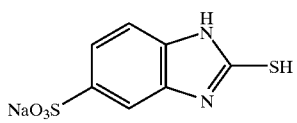
(A-6)

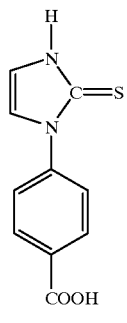
(A-7)

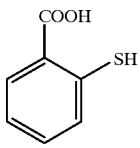
(A-8)

The mercapto compound according to the present invention is preferably added to the silver halide emulsion layer, but may be added to an intermediate layer which is provided depending on necessity or to an uppermost layer (an over layer), or may be added to a plural number of layers. An amount of the mercapto compound to be added is preferably $10^{-4}$ to $10^{-2}$ mole, more preferably $5 \times 10^{-4}$ to $10^{-3}$ mole per mole of silver halide when the compound is added to the silver halide emulsion layer. When it is added to the other layer, the amount of the mercapto compound is preferably larger than the above amount. The timing of addition may be any time until coating a coating solution. A nitrogen-containing heterocyclic compound having a mercapto group other than the present invention or a nitrogen-containing heterocyclic compound having no mercapto group may be used in combination with the mercapto compound of the present invention.

In the aluminum lithographic printing plate material of the present invention, by making the total amount of a calcium ion contained in the whole constituent layer constituting said lithographic printing plate 1,000 ppm or less, washing off property (removal of the silver halide emulsion layer) at washing can be improved.

As the layer constituting the aluminum lithographic printing plate material, there may be mentioned, for example, a physical development nuclei layer, an intermediate layer, a silver halide emulsion layer, a protective layer, etc. The total calcium ion contained in all of these layers is 1,000 ppm or less, preferably 500 ppm or less, more preferably 300 ppm or less.

Gelatin to be used in a silver halide emulsion layer, etc. generally contains 3,000 to 5,000 ppm of calcium ion. When the silver halide emulsion layer is subjected to washing off in the washing process, the calcium ions in gelatin are dissolved in the washing solution whereby the content of the calcium ion in the washing solution increases. This calcium ion is considered to lower washing off property of the silver halide emulsion layer. Also, it has been found that calcium in the washing solution deposits and is accumulated on rollers, particularly on scrubbing rollers for peeling and removing the silver halide emulsion layer and also inhibits washing off property.

Thus, in the silver halide emulsion layer or in other constituent layers, it is preferred to use gelatin subjected to desalting treatment. Preferably used is gelatin having a calcium ion content of 1,000 ppm or less, more preferably 500 ppm or less, further preferably 300 ppm or less. These gelatins are available from respective gelatin manufacturers.

An aluminum substrate to be employed in a lithographic printing plate is generally subjected to surface roughening treatment to improve damping (water retention characteristics) to water and improve adhesiveness to the photosensitive layer. In the surface roughening treatment (so-called "graining"), there has been known mechanical surface roughening treatments such as ball graining, wire graining, brush graining, etc.; electrolysis surface-roughening treatment by chemically dissolving aluminum using a chloride, a fluoride, etc.; and a roughening method using the above methods in combination. For example, they are described in Japanese Provisional Patent Publications No. 28123/1973, No. 123204/1978, No. 146234/1979, No. 25381/1980, No. 132294/1980, No. 55291/1981, No. 150593/1981, No. 28893/1981 and No. 167296/1983, U.S. Pat. No. 2,344,510, U.S. Pat. No. 2,861,917, U.S. Pat. No. 4,301,299 and the like. As for surface shape of the aluminum plate, there are described a grain structure which is significantly complexed by subjecting the mechanical surface roughening and electrolysis surface roughening in U.S. Pat. No. 2,344,510, an accumulated frequency distribution of a pit size and a center line roughness in U.S. Pat. No. 4,301,299, a depth of a roughened surface in U.S. Pat. No. 3,861,917, a height and a diameter of a mountain of a roughened surface in Canadian Patent No. 955,449, and a difference between the highest value and the lowest value of a roughened surface in German Patent No. 1,813,443, respectively.

After subjecting to such a surface roughening treatment as mentioned above, an anodizing treatment is performed in an electrolyte such as sulfuric acid, phosphoric acid, nitric acid or a mixed solution thereof.

A thickness of the anodized layer on the aluminum substrate which is subjected to surface roughening treatment and anodizing treatment is preferably within the range of about 0.3 to 3.0 μm. Before subjecting to the anodizing treatment, it is preferred to carry out desmutting treatment. That is, by treating the aluminum substrate subjected to roughening treatment with a hot sulfuric acid (at 40 to 60° C.) at 10 to 50° C. or a diluted alkali (sodium hydroxide, etc.), desmutting attached to the surface thereof can be removed.

Also, after subjecting to anodizing treatment, a post-treatment may be carried out if necessary. For example, a method of dipping the substrate in an aqueous solution containing polyvinylsulfonic acid as disclosed in G.B. Patent No. 1,230,447 may be used. Also, if necessary, it is possible to provide a subbing layer comprising a hydrophilic polymer, but the material is selected depending on the characteristics of a photosensitive layer provided thereon.

As the physical development nuclei in a physical development nuclei layer to be used in the present invention, known physical development nuclei used in the silver complex diffusion transfer process may be used. As an example thereof, there may be used a colloid of gold, silver or the like, a metal sulfide obtained by mixing a water-soluble salt of silver, palladium, zinc and the like with a sulfide, and so on. As a protective colloid, various hydrophilic colloids including the low molecular weight gelatin of the present invention may be used. With respect to details of the physical development nuclei and preparation process thereof, reference can be made to, for example, Japanese Patent Publication No. 30562/1973, Japanese Provisional Patent Publications No. 55402/1973 and No. 21602/1978, and Andre Rott and Edith Weyde, "Photographic Silver Halide Diffusion Processes", published by the Focal Press, London and New York (1972).

For preparing a silver halide emulsion, gelatin, casein, dextrin, gum Arabic, polyvinyl alcohol, starch, etc. may be used as a protective colloid, and among these, gelatin is most popularly used. Gelatin includes a number of gelatins such as an acid-treated gelatin, an alkali-treated gelatin, a gelatin derivative, a grafted gelatin, etc., but the high molecular weight photographic gelatin is generally employed.

As the gelatin to be preferably used as a protective colloid for a silver halide emulsion of the lithographic printing plate of the present invention, an alkali-treated gelatin is preferred. An amount of the gelatin is preferably 0.3 to 5 g per 1 g of silver halide in terms of silver nitrate. Also, casein, dextrin, gum Arabic, polyvinyl alcohol, starch, etc. may be used in place of part of the gelatin in combination.

In the present invention, as the silver halide emulsion, silver chloride, silver chlorobromide, silver chloroiodide, silver chloroiodobromide may be used. It is preferred to use a silver halide emulsion having a composition containing 70 mole % or more of silver chloride in combination with the above-mentioned sensitizing dye to be used in the present invention.

An average particle size of said silver halide crystal is preferably 0.15 to 0.5 $\mu$m, more preferably 0.20 to 0.45 $\mu$m.

In general, as the shape of the silver halide crystal, there are hexahedral crystal, octahedral crystal, hexadecahedral crystal, tabular crystal and the like, and as the shape of the silver halide crystal to be used in the lithographic printing plate of the present invention, hexahedral crystal is preferred.

Moreover, when forming a silver halide crystal, an iridium compound and a rhodium compound may be added to.

The silver halide emulsion to be used in the lithographic printing plate of the present invention may be subjected to chemical sensitization such as reduction sensitization, sulfur sensitization, gold sensitization, sulfur-gold sensitization to obtain a higher sensitivity.

In the silver halide emulsion layer of the lithographic printing plate according to the present invention, various kinds of surfactants such as anion, cation, betaine, and nonion type ones; a film thickening agent such as carboxymethyl cellulose, etc.; a coating aid such as a defoaming agent; a chelating agent such as ethylenediaminetetra-acetate; a developing agent such as hydroquinone, polyhydroxybenzenes, 3-pyrazolidinones, etc., may be added. In the lithographic printing plate of the present invention, an intermediate layer may be optionally provided between the silver halide emulsion layer and the physical development nuclei layer if necessary, and a protective layer may be also provided as an uppermost layer.

To the developing solution to be used in the present invention, additives including a developing agent such as hydroquinone, polyhydroxybenzenes and 3-pyrazolidinones; an alkaline substance such as potassium hydroxide, sodium hydroxide, lithium hydroxide and sodium tertiary phosphate; a solvent for silver halide such as sodium thiosulfate, potassium thiocyanate and alkanol amine; a preservative such as sodium sulfite; a thickening agent such as carboxymethyl cellulose; an antifoggant such as potassium bromide and 1-phenyl-5-mercaptotetrazole; and a development modifier such as a polyoxyalkylene compound, etc. may be added. Also, after development, in order to improve ink receptivity, the prepared plate may be subjected to an oil-receptive processing by an oil-receptive solution containing a mercapto compound such as 1-phenyl-5-mercaptotetrazole, etc., and further to store the plate prepared, a finishing solution containing gum Arabic, etc. may be coated to the plate.

A pH of the developing solution is generally about 10 to 14, preferably about 12 to 14. This varies depending on the pre-treatment conditions (such as anodization) of an aluminum support of the lithographic printing plate to be used, photographic elements, desired image, kinds and amounts of the respective compounds in the developing solution, development conditions, etc.

Washing off for removing the gelatin layer can be carried out by washing away with a running water at a temperature of about 20 to 40° C.

EXAMPLES

In the following, the present invention is explained by referring to Examples by which the present invention is not limited.

Example 1

An aluminum plate having a thickness of 0.30 mm to which pits with a diameter of 0.03 to 0.30 $\mu$m had been formed with about 5,600 per 100 $\mu$m$^2$ on a plateau with an average diameter of about 5 $\mu$m, and the pit has an average diameter of 0.08 $\mu$m was prepared by the electrolysis surface roughening treatment and the anodization treatment. This aluminum plate was subjected to anodization after the surface roughening treatment, and had an average roughness (Ra) of 0.5 to 0.6 $\mu$m.

On the aluminum support, a palladium sulfate nucleus solution was coated and then dried. An amount of nucleus contained in the physical development nuclei layer was 3 mg/m$^2$.

Preparation of a silver halide emulsion layer was carried out by using gelatin A for photography having a weight average molecular weight of 100,000 and doping potassium hexachloroiridate (IV) having an average particle size of 0.25 $\mu$m in an amount of 0.006 mmole per mole of silver by the control double jet method to prepare a silver chloroiodobromide emulsion containing 15 mole % of silver bromide and 0.4 mole % of silver iodide. Thereafter, this emulsion was flocculated, and washed. This emulsion was then subjected to sulfur-gold sensitization, a stabilizer was added thereto and then the material was spectrally sensitized by using a sensitizing dye (D-8). This is called to as Emulsion A.

In the same manner as in the preparation of Emulsion A except for using gelatin B having a weight average molecular weight of 70,000 or gelatin C having a weight average molecular weight of 40,000 in place of the gelatin A for photography, Emulsion B and C were prepared, respectively.

Then, the above-mentioned Emulsion A was divided into five portions, and to the respective emulsions was each added, as an additional gelatin, the above-mentioned gelatin A, the above-mentioned gelatin B, the above-mentioned gelatin C, a gelatin D having a weight average molecular weight of 20,000 or a gelatin E having a weight average molecular weight of 10,000 each in an amount of 20% by weight based on the amount of the gelatin A for photography in the emulsion. In the same manner as mentioned above, as an additional gelatin, the gelatin B was added to the abovementioned Emulsion B, and the gelatin C to the above-mentioned Emulsion C, respectively, each in an amount of 20% by weight based on the amount of gelatin in the emulsion. In the respective emulsions, final adjustment was performed so as to contain the total gelatin amount of 1.2 g per 1.0 g of silver. Then, the respective emulsions were each coated on the aluminum plate to which the above-mentioned physical development nuclei layer had been coated so as to become the silver amount of 2.0 g/m$^2$ and dried to prepare lithographic printing plates of the present invention and comparative purpose as shown in Table 1.

Respective 50 plates of these samples were subjected to output with a dissolution of 2400 dpi while changing a laser power using an output machine having a red LD laser at 633 nm as a light source, development (dipped at 22° C. for 15 seconds) by the developing solution for DTR as mentioned below, washing (washing off the silver halide emulsion layer with a warm water of 35° C.), and, after subjecting to plate surface treatment by a finishing solution, drying to prepare lithographic printing plates. As for the output, a laser power when widths of negative ruled line and positive ruled line each with 50 μm became the same is made proper exposure.

| (Developing solution for DTR) | |
|---|---|
| Sodium hydroxide | 20 g |
| Hydroquinone | 20 g |
| 1-Phenyl-3-pyrazolidinone | 2 g |
| Anhydrous sodium sulfite | 80 g |
| Monomethylethanol amine | 6 g |
| Sodium thiosulfate (hexahydrate) | 8 g |
| Ethylenediamine tetraacetate sodium salt | 5 g |
| Make up to 1,000 ml with deionized water. | |
| pH (25° C.) = 13.4 | |

The thus prepared lithographic printing plates were subjected to printing by applying to a web-offset press printing machine. Printing endurance was evaluated by the following standard with a number of sheets at which ink failure or stain of ground was caused.

A: 100,000 sheets or more
B: 50,000 to 100,000 sheets
C: less than 50,000 sheets An ink removable property was evaluated by the following evaluation standard by mounting a printing plate to a web-offset press printing machine, and after applying an ink to the plate surface, damping water was fed and counting a number of sheets until ink stain at a non-image portion disappeared. The results are shown in Table 1. The upper section shows the result of the first plate and the lower section shows that of the 50th plate.

A: 10 sheets or less
B: 10 to 20 sheets
C: 20 to 50 sheets
D: 50 to 100 sheets
E: more than 100 sheets

TABLE 1

| Sample | Gelatin in emulsion | Additional gelatin | Printing endurance | Ink removable property | Remarks |
|---|---|---|---|---|---|
| 1 | A | A | A | D | Comparative |
|   |   |   | B | D |   |
| 2 | B | B | A | C | Comparative |
|   |   |   | B | D |   |
| 3 | C | C | A | B | Comparative |
|   |   |   | C | D |   |
| 4 | A | B | A | C | Comparative |
|   |   |   | B | D |   |
| 5 | A | C | A | A | Present invention |
|   |   |   | B | B |   |
| 6 | A | D | A | A | Present invention |
|   |   |   | A | A |   |
| 7 | A | E | A | A | Present invention |
|   |   |   | A | A |   |

As clearly seen from the results shown in Table 1, Samples 5 to 7 which are aluminum lithographic printing plates of the present invention are excellent in printing endurance and ink removable property as compared with those of Comparative samples 1 to 4, and it was confirmed that the excellent properties were maintained after running processing.

Example 2

In the same manner as in Sample 1 of Example 1, a lithographic printing material was prepared except for providing an intermediate layer with a gelatin content of 0.5 g/m$^2$ between the silver halide emulsion layer and the physical development nuclei layer. As the gelatin for the intermediate layer, the low molecular weight gelatin D or E used in Example 1 was used to prepare two kinds of lithographic printing plate materials according to the present invention. These materials were evaluated in the same manner as in Example 1, the similar results as in Samples 6 and 7 of Example 1 were obtained.

Example 3

In the same manner as in Sample 6 of Example 1 except for using a silver chloroiodobromide emulsion with silver chloride of 98 mole % and silver iodide of 0.4 mole % and a sensitizing dye (D-10) in the preparation of the silver halide emulsion A in Example 1, Emulsion A-2 was prepared. Between the physical development nuclei layer formed on the aluminum substrate prepared in Example 1 and a silver halide emulsion layer using Emulsion A-2, an intermediate layer was provided by coating each 0.5 g of gelatins A to E in Example 1 per 1 m$^2$ to prepare five kinds of lithographic printing plates of the present invention. Printing was carried out by using these lithographic printing plates in the same manner as in Example 1. As the results, the samples using the gelatins C to E in the intermediate layers were more excellent in ink removable property and printing endurance as compared with those using the gelatins A and B in the intermediate layers.

Example 4

In the same manner as in Example 1, a palladium sulfide nuclei solution was coated on an aluminum substrate.

Preparation of a silver halide emulsion layer was carried out by using gelatin A for photography having a weight average molecular weight of 100,000 and doping potassium hexachloroiridate (IV) having an average particle size of 0.25 μm in an amount of 0.006 mmole per mole of silver by the control double jet method to prepare a silver chloroiodobromide emulsion containing 15 mole % of silver bromide and 0.4 mole % of silver iodide. Thereafter, this emulsion was flocculated, and washed with water.

This emulsion was then subjected to sulfur-gold sensitization, 2-mercaptobenzoic acid and 1-phenyl-5-mercaptotetrazole were added thereto each in amounts of $10^{-3}$ mole per mole of silver halide. The emulsion divided and spectrally sensitized by using the sensitizing dyes shown in Table 2 each 3 mg per 1 g of silver. Further, to these respective silver halide emulsions, either of the above-mentioned gelatin A for photography, the above-mentioned low molecular weight gelatin D having a weight average molecular weight of 20,000, or the above-mentioned low molecular weight gelatin E having a weight average molecular weight of 10,000 used in Example 1 was added each in an amount of 5% by weight based on the amount of the gelatin A for photography in the silver halide emulsion. In the respective emulsions, final adjustment was performed so as to contain the total gelatin amount of 1.3 g per 1.0 g of silver. Then, the respective emulsions were each coated on the aluminum plate to which the above-mentioned physical development nuclei layer had been coated so as to become the silver amount of 2.0 g/m² and dried to prepare samples.

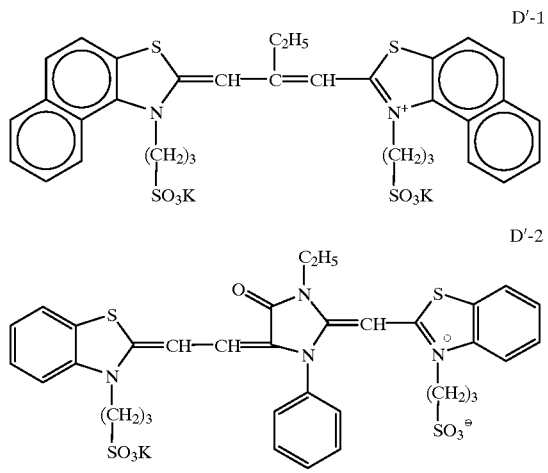

These samples were subjected to exposure immediately after preparation, and after 5 days preservation under the conditions of at 50° C. and a relative humidity of 80%, respective samples were subjected to output with a dissolution of 2400 dpi while changing a laser power using an output machine having a red LD laser at 633 nm as a light source, development (dipped at 22° C. for 15 seconds) by the developing solution for DTR as mentioned above, washing (washing off the silver halide emulsion layer with a warm water of 30° C.), and, after subjecting to plate surface treatment by a finishing solution, drying to prepare lithographic printing plates. As for the output, a laser power when widths of negative ruled lines and positive ruled lines each with 50 μm became the same is made proper exposure.

Further, a line image with a width of 8 to 24 μm (about 2 μm step) was output by a laser power which became proper exposure, and after plate preparation processing, the resulting plate was mounted on a printer to effect printing. Printing endurance and ink removable property were evaluated in the same manner as in Example 1.

| (Developing solution for DTR) | |
|---|---|
| Sodium hydroxide | 20 g |
| Hydroquinone | 20 g |
| 1-Phenyl-3-pyrazolidinone | 2 g |
| Anhydrous sodium sulfite | 80 g |
| Monomethylethanol amine | 6 g |
| Sodium thiosulfate (hexahydrate) | 8 g |
| Ethylenediamine tetraacetate sodium salt | 5 g |
| Make up to 1,000 ml with deionized water. | |
| pH (25° C.) = 12.8 | |

Also, white dot was evaluated with the degree of generating dot-like white portion at the transferred silver image portion by the following evaluation standard.

A: No occurrence.

B: Slightly occurred.

C: Remarkably occurred.

The results are shown in Table 2. The upper section shows the result of immediately after preparation and the lower section shows the result of after preservation.

TABLE 2

| Sample | Sensitizing dye | Additional gelatin | Printing endurance | White dot | Ink removable property |
|---|---|---|---|---|---|
| 8 | D-4 | A | A | A | C |
|   |     |   | B | A | C |
| 9 | D-4 | E | A | A | A |
|   |     |   | A | A | A |
| 10 | D-8 | A | A | A | C |
|    |     |   | B | A | C |
| 11 | D-8 | E | A | A | A |
|    |     |   | A | A | A |
| 12 | D-8 | D | A | A | A |
|    |     |   | B | A | A |
| 13 | D'-1 | A | A | A | C |
|    |      |   | C | C | D |
| 14 | D'-1 | E | A | A | B |
|    |      |   | C | C | C |
| 15 | D'-2 | A | A | A | C |
|    |      |   | C | C | D |
| 16 | D'-2 | E | A | A | B |
|    |      |   | C | C | C |

As clearly seen from the results shown in Table 2, Samples 9, 11 and 12 which use a low molecular weight gelatin and a sensitizing dye having no acidic group are excellent in printing endurance, ink removable property and dot-like fogging (white dots) after preservation.

Example 5

In the same manner as in Example 4 except for using a silver chloroiodobromide containing 98 mole % of silver chloride and 0.4 mole % of silver iodide for preparation of a silver halide emulsion and using D-10 or D-12 as a sensitizing dye, silver halide emulsions were prepared. With regard to the respective emulsions, the low molecular weight gelatin E is used in an amount of 10% by weight based on the gelatin A for photography, or the low molecular weight gelatin D is used in an amount of 50% by weight based on the gelatin A for photography, four kinds of samples were prepared. When these samples were evaluated in the same manner as in Example 4, they are excellent in printing endurance, ink removable property and dot-like fogging (white dots) after preservation similarly as in Samples 9, 11 and 12 in Example 4.

Example 6

In the same manner as in Sample 7 of Example 1, a lithographic printing plate material was prepared except for using A-3, A-5, A-8 or A'-1 mentioned below as a compound having both of an acidic group and a mercapto group each in an amount of $10^{-3}$ mole in a silver halide emulsion. Further, a sample to which no mercapto compound was added was prepared.

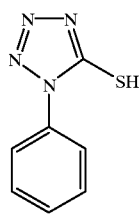

A'-1

With regard to five kinds of lithographic printing materials prepared as mentioned above, samples immediately after preparation and samples after 5 days preserved under the conditions of at 50° C. and a relative humidity of 80% were prepared, respectively. As to these samples, fine-line reproducibility was evaluated.

Next, respective samples were subjected to output with a dissolution of 2400 dpi while changing a laser power using an output machine having a red LD laser at 633 nm as a light source. As for the output, a laser power when the sizes of dots at 5% and those of dots at 95% became the same with 175 lpi (line per inch) dots are made proper exposure.

Next, a line image with a width of 8 to 24 μm (about 2 μm step) was output by a laser power which became proper exposure. Next, in the same manner as in Example 1, lithographic printing plates were prepared by effecting development, washing off and finishing processings. These lithographic printing plates were each mounted on a printing press Heidelberg TOK (trade name, an offset printing press available from Heidelberg) and printing was carried out. At the 1,000th and 50,000th printing, the printed materials were sampled and these printed materials were evaluated by the width of the lines reproduced on the printed material and appearance of fine lines were compared. The results are shown in Table 3. In Table 3, when the numerical value is small, the printed material is excellent. In Table 3, the upper section shows the result of immediately after preparation and the lower section shows the result of after preservation.

TABLE 3

| Sample | Sensitizing dye | Mercapto compound | Fine-line reproducibility (μm) | |
|---|---|---|---|---|
| | | | 1,000th sheet | 50,000th sheet |
| 17 | D-8 | None | 17 | 19 |
| | | | 20 | 23 |
| 18 | D-8 | A-3 | 14 | 14 |
| | | | 15 | 15 |
| 19 | D-8 | A-5 | 14 | 14 |
| | | | 15 | 15 |
| 20 | D-8 | A-8 | 14 | 14 |
| | | | 14 | 15 |
| 21 | D-8 | A'-1 | 16 | 19 |
| | | | 19 | 21 |

As clearly seen from the above Table 3, it can be understood that Samples 18 to 20 each of which contain a sensitizing dye (D-8) having no acidic group and a compound having both of an acidic group and a mercapto group are excellent in fine line reproducibility and also excellent in stability after preservation.

Example 7

In the same manner as in Sample 7 of Example 1, lithographic printing materials were prepared except for using various kinds of gelatins each containing 100 ppm to 5,000 ppm of a calcium ion to prepare various kinds of silver halide emulsions so as to become the calcium ion content in the total constituent layers (in this Example, a silver halide emulsion layer and a physical development nuclei layer) of the lithographic printing plate materials to those shown in Table 4.

Respective lithographic printing plate materials were subjected to image-output using an output machine having a red LD laser at 633 nm as a light source to prepare lithographic printing plates, respectively. The processor for preparing a plate is constituted by a development processing (dipped at 22° C. for 15 seconds), washing processing (peeling off the emulsion layer by scrub rollers while shower spreading a washing water at 33° C. for 12 seconds), finishing processing (showered at 21° C. for 5 seconds), and drying processing. The washing processing of said processor for preparing a plate is constituted by a tank storing 30 liters of a washing solution, an unit of supplying the solution from the tank to the lithographic printing plate material through a pump to peel of and remove the emulsion layer, and an unit of circulating the washing water from the tank through a filtration filter provided at outside the system. As the filtration filter, a cylindrical type filter with a size of 5 μm was used.

By using the developing solution, washing solution and finishing solution mentioned below, 100 plates were treated with the size of A2.

| (Developing solution) | |
|---|---|
| Sodium hydroxide | 20 g |
| Hydroquinone | 20 g |
| 1-Phenyl-3-pyrazolidinone | 2 g |
| Anhydrous sodium sulfite | 80 g |
| Monomethylethanol amine | 6 g |
| 2-Mercapto-5-n-heptyl-oxadiazole | 0.5 g |
| Anhydrous sodium thiosulfate | 6 g |
| Ethylenediamine tetraacetate sodium salt | 5 g |
| Polyethylene glycol (average molecular weight 400) | 10 g |
| Make up to 1,000 cc with addition of water. pH was adjusted to 13.0. | |
| (Washing solution) | |
| Potassium primary phosphate | 40 g |
| Diethylenetriamine pentaacetate | 20 g |
| Make up to 1000 cc with addition of water. pH was adjusted to 6.0 | |
| (Finishing solution) | |
| Gum Arabic | 10 g |
| 2-Mercapto-5-n-heptyl-oxadiazole | 1 g |
| Triethanolamine | 26 g |
| Sodium primary phosphate | 10 g |
| Make up to 1,000 cc with addition of water pH was adjusted to 6.0. | |

With regard to 10th plate, 50th plate and 100th plate of the lithographic printing plates prepared by the methods as mentioned above, printing was carried out by using a printing press Heidelberg MO (trade name, an offset printing press available from Heidelberg attached with an Alcolor water supply installation), an ink (New Champion Black H available from Dainippon Ink Co.) and a commercially available humidifying solution for a PS plate (metal plate), and ink receptivity at the time of starting printing was evaluated. As to water retention characteristics, printing was carried out by changing the ink to a low viscosity ink (New Champion Purple S available from Dainippon Ink Co.) and the characteristics were evaluated. The results are shown in Table 4.

Ink receptivity was evaluated by a number of sheets until no change in density of image occurs after initiation of printing. Water retention characteristics were evaluated with four ranks by adding 15% of isopropyl alcohol (IPA) to the above-mentioned humidifying solution, and stain at a non-image portion was observed by gradually decreasing an amount of IPA. 4 is completely no stain, 3 is an extremely slight stain can be confirmed, 2 is partially stained and 1 is stain occurs at whole surface.

TABLE 4

| Lithographic printing plate | Calcium content (ppm) | Ink receptivity | | | Water retention characteristics | | |
|---|---|---|---|---|---|---|---|
| | | 10th plate | 50th plate | 100th plate | 10th plate | 50th plate | 100th plate |
| 22 | 4,000 | 25 | 35 | 56 | 3 | 2 | 1 |
| 23 | 2,000 | 25 | 36 | 57 | 3 | 2 | 1 |
| 24 | 800 | 18 | 21 | 25 | 4 | 4 | 3 |
| 25 | 500 | 13 | 13 | 15 | 4 | 4 | 3 |
| 26 | 100 | 10 | 11 | 12 | 4 | 4 | 4 |

As can be seen from the above results, by making a calcium ion content in the lithographic printing plate 1,000 ppm or less, excellent ink receptivity and water retention characteristics can be obtained. Particularly deterioration in ink receptivity and water retention characteristics by a running processing can be restrained.

In the above plate preparing processing, the state of deposited materials adhered to rollers in the washing processing of a processor for plate preparation was observed. The results are shown in Table 5.

(Evaluation standard) ⊙: Completely no deposition. ○: Slightly deposited. Δ: Adhered deposits are noticeable but no damage on the plate surface. X: Adhered deposits are significant and damage occurred on the plate surface.

TABLE 5

| Lithographic printing plate | Adhered state of deposited materials | |
|---|---|---|
| | 50th plate | 100th plate |
| 22 | Δ | X |
| 23 | Δ | X |
| 24 | ○ | Δ |
| 25 | ⊙ | ○ |
| 26 | ⊙ | ○ |

As can be seen from the results shown in Table 5, when the amount of the calcium ion in the whole layers of the lithographic printing plate is made not more than 1,000 ppm, more excellent results can be obtained.

What is claimed is:

1. An aluminum lithographic printing plate material which comprises an aluminum substrate, a silver halide emulsion layer and a physical development nuclei layer between the aluminum substrate and the silver halide emulsion layer, said silver halide emulsion layer contains photographic gelatin having a weight average molecular weight of about 100,000 or more and gelatin having a weight average molecular weight of about 30,000 or less in an amount of 5 to 50% by weight based on the amount of the photographic gelatin, and sensitizing dye having no acidic group.

2. The aluminum lithographic printing plate material according to claim 1, wherein at least one of the layer on the side of the silver halide emulsion layer contains a compound having an acidic group and a mercapto group.

3. The aluminum lithographic printing plate material according to claim 1, wherein a total calcium ion content in the whole constituent layers of said lithographic printing plate material is 1,000 ppm or less.

4. The aluminum lithographic printing plate material according to claim 1, wherein the gelatin contains a calcium ion in an amount of 1,000 ppm or less.

5. The aluminum lithographic printing plate material according to claim 1, wherein said sensitizing dye having no acidic group is a compound represented by any one of the following formulae (I) to (III):

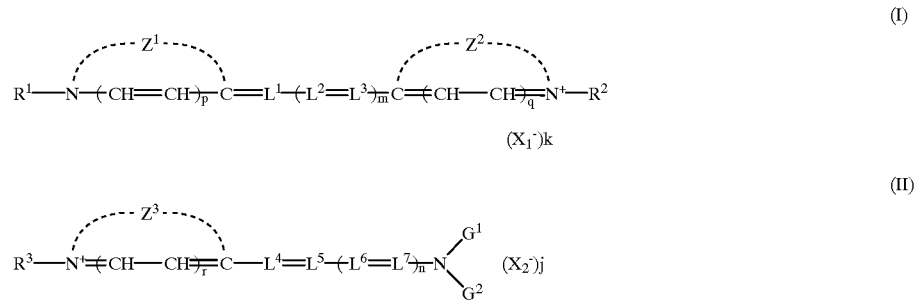

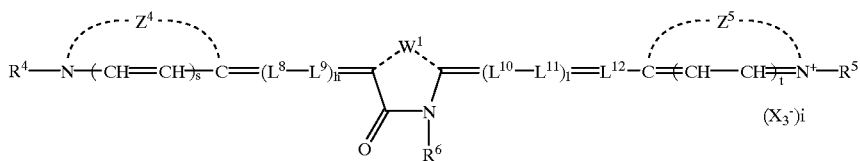

(III)

wherein $Z^1$ to $Z^5$ each represent atomic group necessary for forming a 5- or 6-membered heterocyclic ring, and the heterocyclic rings are two or more, the respective heterocyclic rings may be the same or different from each other; $R^1$ to $R^5$ may be the same or different from each other and each represent a substituted or unsubstituted alkyl group; R6 represents a hydrogen atom, a substituted or unsubstituted alkyl group, a substituted or unsubstituted aryl group or a heterocyclic group; $G^1$ and $G^2$ may be the same or different from each other and represent a substituted or unsubstituted alkyl group, a substituted or unsubstituted aryl group; or $G^1$ and $G^2$ may form a ring with derived from a cyclic secondary amine; $W^1$ represents atomic group necessary for forming a 5- or 6-membered heterocyclic ring; $L^1$ to $L^{12}$ each represent a substituted or unsubstituted methyne group; p, q, r, s and t each represent 0 or 1, h, l and m represents 0, 1, 2 or 3; k and i represents 0 or 1; j represents 1 or 2; n represents 0, 1 or 2; $X^1$ to $X^3$ represents a counter ion.

6. The aluminum lithographic printing plate material according to claim 2, wherein the compound having an acidic group and a mercapto group is a compound represented by the following formula:

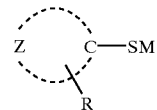

wherein R represents one or two or more sulfo group or carboxyl group bound to a carbon atom or a nitrogen atom of a heterocyclic group or an aromatic ring directly or through an alkyl group or an aryl group; Z represents an atomic group necessary for forming a 5- or 6-membered nitrogen-containing heterocyclic ring or an aromatic ring; and M represents a metal atom or an ammonium group.

* * * * *